(12) United States Patent
Goldstein et al.

(10) Patent No.: US 7,527,920 B2
(45) Date of Patent: *May 5, 2009

(54) ACTIVE HARDMASK FOR LITHOGRAPHIC PATTERNING

(75) Inventors: Michael Goldstein, Ridgefield, CT (US); Manish Chandhok, Portland, OR (US); Eric Panning, Pleasanton, CA (US); Robert Bristol, Portland, OR (US); Bryan J. Rice, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 59 days.

This patent is subject to a terminal disclaimer.

(21) Appl. No.: 11/293,594

(22) Filed: Dec. 2, 2005

(65) Prior Publication Data

US 2006/0093972 A1    May 4, 2006

Related U.S. Application Data

(63) Continuation of application No. 10/423,466, filed on Apr. 24, 2003, now Pat. No. 7,033,739.

(51) Int. Cl.
G03F 7/20 (2006.01)
(52) U.S. Cl. ..................... 430/396; 430/322
(58) Field of Classification Search ................ 430/322, 430/396
See application file for complete search history.

(56) References Cited

U.S. PATENT DOCUMENTS 6,830,850 B1    12/2004  Krivokapic et al.

*Primary Examiner*—Kathleen Duda
(74) *Attorney, Agent, or Firm*—Fish & Richardson P.C.

(57) ABSTRACT

In an implementation, energy reaching the lower surface of a photoresist may be redirected back into the photoresist material. This may be done by, for example, reflecting and/or fluorescing the energy from a hardmask provided on the wafer surface back into the photoresist.

12 Claims, 6 Drawing Sheets

| Material (Bottom/Top) | Period (nm) | Ratio bottom/period | Periods | Reflectivity (%) |
|---|---|---|---|---|
| W/Si | 6.9 | 0.4 | 10 | 19 |
| TiN/Si | 6.9 | 0.45 | 10 | 20 |
| RuTa/Si | 6.9 | 0.45 | 10 | 20 |
| Pt/Si | 6.9 | 0.35 | 10 | 30 |
| Mo/Si | 6.9 | 0.4 | 10 | 33 |
| PtN/Si | 6.9 | 0.35 | 10 | 35 |
| Ru/Si | 7.0 | 0.45 | 10 | 46 |
| RuN/Si | 7.0 | 0.42 | 10 | 48 |
| PtN/Si | 6.9 | 0.35 | 15 | 43 |
| Mo/Si | 6.9 | 0.4 | 15 | 51 |
| Ru/Si | 7.0 | 0.45 | 15 | 58 |
| RuN/Si | 7.0 | 0.42 | 15 | 59 |

FIG. 1B

ACTIVE HARDMASK FOR LITHOGRAPHIC PATTERNING

CROSS-REFERENCE TO RELATED APPLICATIONS

This application is a continuation application of and claims priority to U.S. patent application Ser. No. 10/423,466, filed Apr. 24, 2003 now U.S. Pat. No. 7,033,739.

BACKGROUND

Photolithographic techniques may be used in the fabrication of semiconductor devices to transfer a pattern (e.g., a circuitry pattern) to a wafer using light or other wavelengths of electromagnetic radiation. The "light" may pass through, or be reflected off of, a mask which defines the pattern. Light from the mask projects an image of the pattern onto the wafer. The wafer is coated with a layer of a photosensitive material, referred to as a "photoresist" or "resist," which undergoes a chemical reaction when exposed to light. After exposure, the resist is baked and developed, leaving regions of the wafer surface covered resist and complementary regions exposed.

The resolution and efficiency of photolithographic systems may be affected by the amount of light coupled into the photoresist. The optical absorbance of photoresist materials used in lithography has increased with decreasing wavelength, especially in the Extreme Ultra-Violet, or EUV (~13.5 nm). As a result less light reaches the underlying substrate (~50% in the EUV). A decreasing index of refraction mismatch between the photoresist and the underlying substrate has also reduced reflections from the substrate back into the photoresist. The net effect is wasted photons.

BRIEF DESCRIPTION OF THE DRAWINGS

FIG. 1B shows a list of some possible material combinations and their reflectivities.

DETAILED DESCRIPTION

Lithography may be performed using various frequencies of electromagnetic radiation. Radiation transmitted from a patterned mask may be coupled into a photoresist material on a wafer. The exposed portions of the photoresist undergo a chemical reaction, e.g., by photosolubization in positive resists or polymerization in negative resists. The amount of energy (photons) coupled to the photoresist may affect system throughput, pattern transfer, and resolution.

Because reflections occur at interfaces when there is an index of refraction mismatch between the materials on each side of the interface, in Deep UV (DUV) lithography reflections from the top and bottom resist interfaces may be so strong that prominent standing waves may be created in the resist. Photons may be absorbed in a first pass as the light enters the photoresist and in a second pass as photons are reflected from the substrate surface. To improve resolution and critical dimension (CD) control, standing waves may be minimized in DUV lithography by the use of anti-reflective hardmasks (bottom ARCS) to control the reflectivity at the interface.

At extreme UV (EUV) frequencies (e.g. 13.5 nm), however, standing waves do not pose a problem because there are very few reflections from the resist-substrate interface because the real part of the index of refraction of materials is close to 1. The lack of reflection means that the energy absorbed in a layer of photoresist in EUV lithography systems occurs only during a single pass of EUV photons through the resist.

The resist materials typically used in EUV lithography have a high absorbance of energy. Consequently, much of the EUV energy is absorbed in the upper portions of the resist. Together with the lack of a reflection in EUV, the high absorbance of the resist at EUV frequencies results in the lower portions of the resist receiving little of the EUV energy. This, in turn, may cause problems in producing vertical sidewalls in the resist pattern; the top of the resist receives more energy than the bottom so, in a positive resist, the top of the channel (areas that will clear after the develop step) will be wider than the bottom. Conversely, in a negative resist, the top of the channel will be narrower than the bottom.

Figure 5:
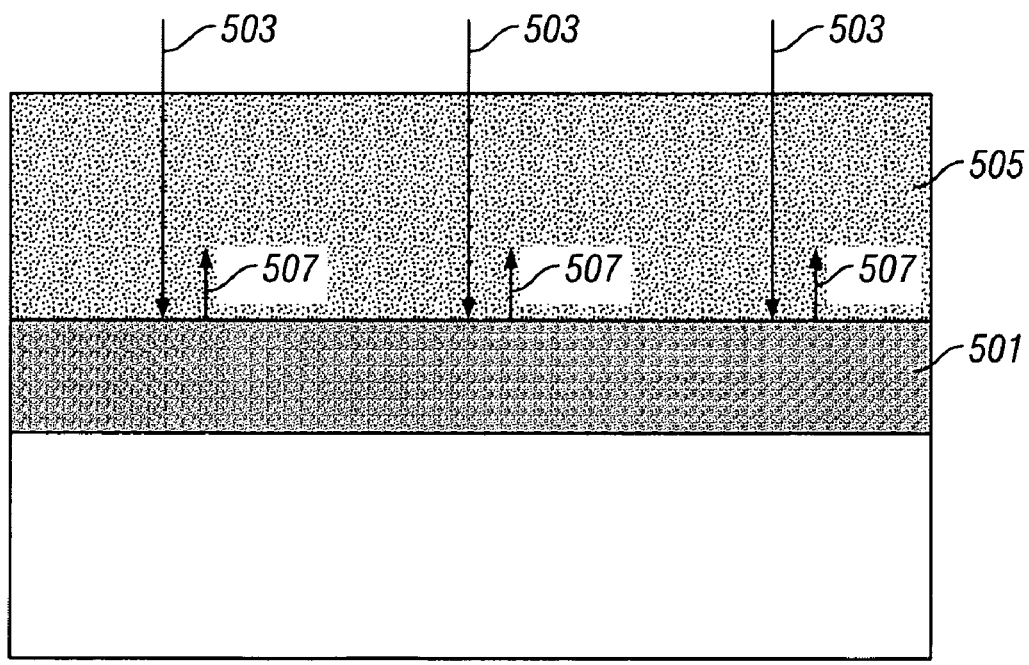
FIG. 5 shows a hardmask reflecting energy back into photoresist material.

These undesirable results may be reduced by, for example, redirecting some of the energy that reaches the lower surface of the photoresist back into the photoresist. In an implementation, the optical properties of the hardmask may be tuned to make it reflective. Thus, as illustrated in FIG. 5, instead of acting as a bottom anti-reflective coating (BARC) to minimize reflection, the hardmask 501 does just the opposite; it reflects EUV energy 503 back into the resist material 505. As a result, instead of receiving only one pass of EUV photons, the lower portions of the resist 505 are exposed to additional EUV photons 507 that would otherwise have simply passed through the bottom surface of the resist 505. Because the lower portions of the resist 505 have absorbed more radiation, the resulting channel sidewalls exhibit an improved profile and are closer to the desired vertical angle.

Although the hardmask 501 is shown as a single layer, it may also be comprised of multiple-layers, as discussed below. Furthermore, although the reflected EUV photons 507 are shown in FIG. 5 as originating at the interface between the resist 505 and the hardmask 501, it should be understood that some or all of the reflection may occur within the hardmask 501.

In addition, because light is being reflected back up into the resist, less overall light is required to expose the resist overall. As a result, the run rate of the lithography tools may be increased.

Figure 1A:
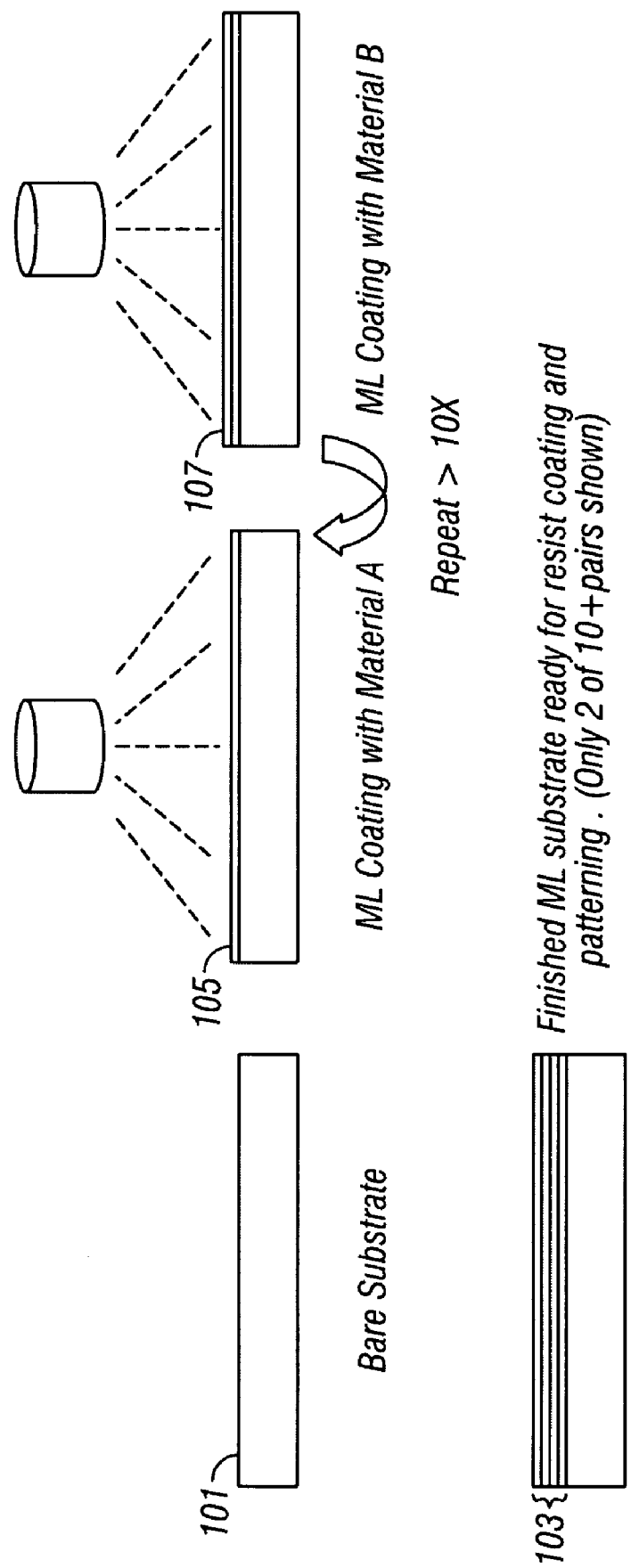
FIG. 1A shows a multilayer coating applied onto a substrate.

As shown in FIG. 1A, a substrate 101 with a layer to be patterned is coated with a reflective hard mask In this configuration, the reflective hardmask is comprised of a multilayer (ML) reflective coating 103. A ML coating is necessary for EUV since no material reflects appreciably at EUV wavelengths. This is because the real part of the index of refraction for all materials at these frequencies is roughly equal to one.

One example of a ML coating 103 is an appropriate Bragg reflector. At longer wavelengths, such as vacuum UV (VUV), e.g. 157 nm, where the real part of the index of refraction varies for different materials, hardmask material of appropriate thickness made of a single layer or a few layers may be chosen.

As mentioned above, the ML structure 103 may employ a Bragg reflector, which is a filter that works on interference properties. In a multilayer Bragg reflector, reflections from each layer add up coherently, in phase, such that even though there is little reflectivity from any one interface, the total reflectivity from many interfaces adds up constructively to be substantial.

In an implementation, the multilayer reflector will produce constructive interference if each layer meets the quarter wavelength criterion, i.e. the thickness of the layer should conform to the following equation: $L=\lambda/(4n)$, where L is the thickness of the layer, $\lambda$ is the wavelength of the light in a vacuum, and n is the real portion of the index of refraction of the layer material.

As shown in FIG. 1A, two different materials, here designated A 105 and B 107, may be used to create the multilayer reflector 103. The substrate 101 is repeatedly coated alternately with materials A and B. In one implementation, the ML coating 103 contains at least ten pairs of A/B layers.

However, the reflective stack 103 may be created from a variety of material combinations that are compatible with standard semiconductor process manufacturing equipment. Standard physical vapor deposition tools may be configured for dual-chamber, in-situ deposition of the multilayers on several wafers simultaneously. In one aspect, deposition may occur on as many as four wafers at once. Furthermore, certain candidate materials for the reflective hardmask may be used as metal gates, which may provide an opportunity for tool synergy and capital cost reduction. A non-exclusive list of some possible material combinations 151 and their reflectivities 153 is provided in FIG. 1B.

In an implementation, molybdenum/silicon (Mo/Si) may be used. In another implementation, ruthenium/silicon (Ru/Si) may be used. Ru/Si has very favorable optical properties, but the process of depositing a defect-free, thin film of ruthenium onto silicon may be difficult. As a result, Mo/Si is commonly used in creating reflective coatings.

Figure 2A:
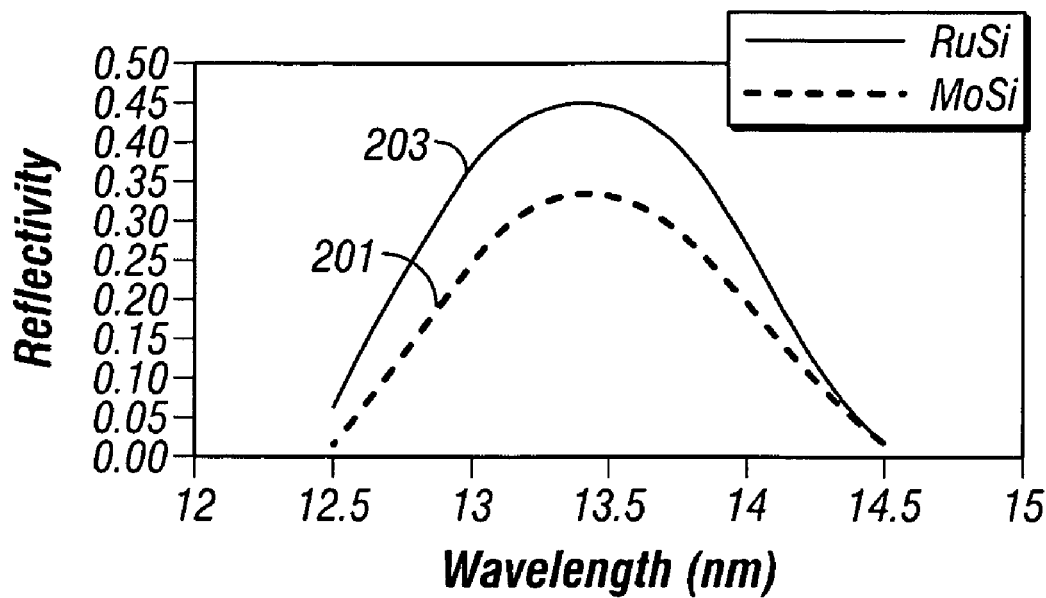
FIG. 2a shows the calculated reflectivity spectrum of representative 10-period multilayers of Mo/Si and Ru/Si, at normal incidence for unpolarized light.
Figure 2B:
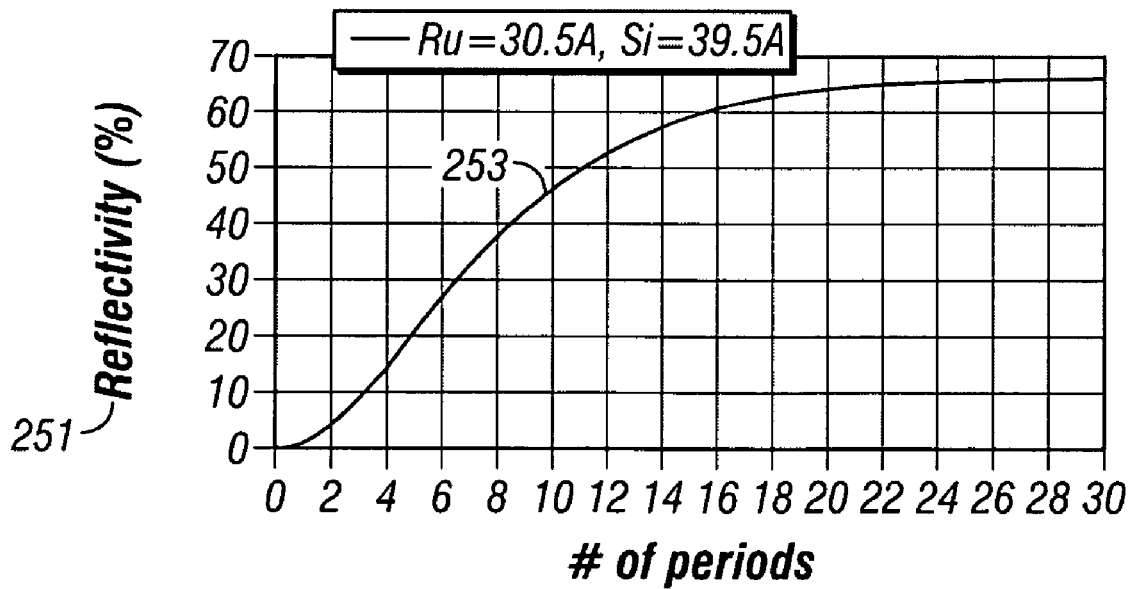
FIG. 2b shows a plot of the reflectivity of a multilayer reflector for various numbers of layers.

FIG. 2a shows the calculated reflectivity spectrum of representative 10-period multilayers of Mo/Si 201 and Ru/Si 203, at normal incidence for unpolarized light. As indicated in the figure, the reflectivity peak of the Mo/Si stack was found to be 33% at 13.5 nm. The peak of the Ru/Si was found to be 45% at 13.5 nm. As FIG. 2b shows, increasing the number of periods of the Ru/Si stack increases the calculated reflectivity 251 even further. By sixteen periods, the reflectivity of a Ru/Si stack 253 increases to 60%, although the addition of subsequent layers increases the reflectivity 251 more slowly.

Although these calculations indicate that Ru/Si is superior to Mo/Si, measured reflectivity of actual samples indicates the opposite, primarily due to greater interfacial diffusion and roughness in the Ru/Si. The multilayer hardmask reflectivity obtained in a workable process flow, therefore, will be lower than the theoretical limits reported here. The final choice in material may depend on many factors, for example, stability, throughput of the deposition tool, and compatibility with gate materials. As technology improves upon these and other factors in deposition processes, the choice of materials used in the multilayer may change.

Figure 3A:
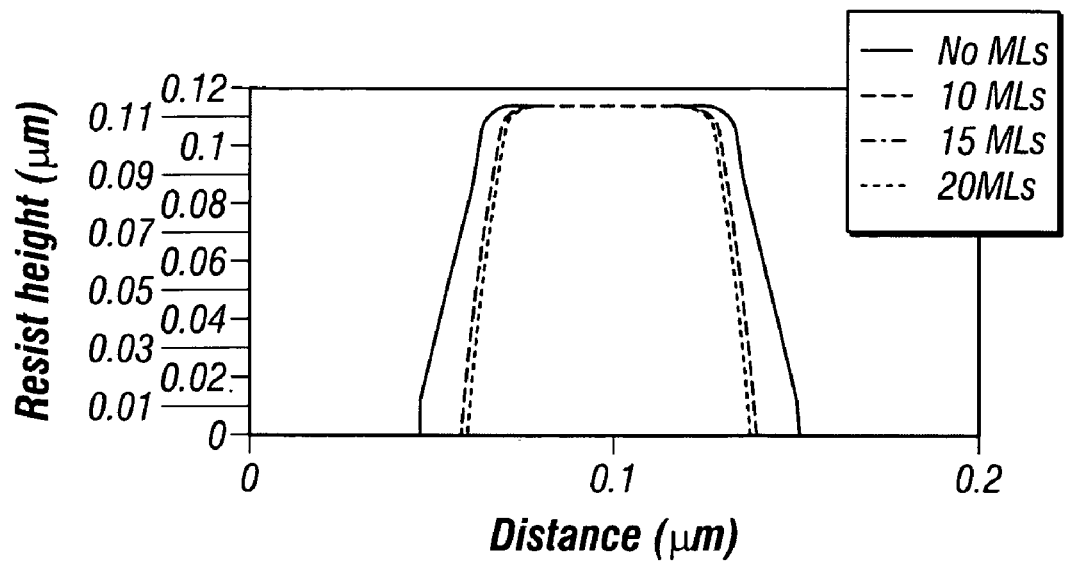
FIG. 3a shows a plot showing the impact of a multilayer reflective hardmask on photoresist profile.
Figure 3B:
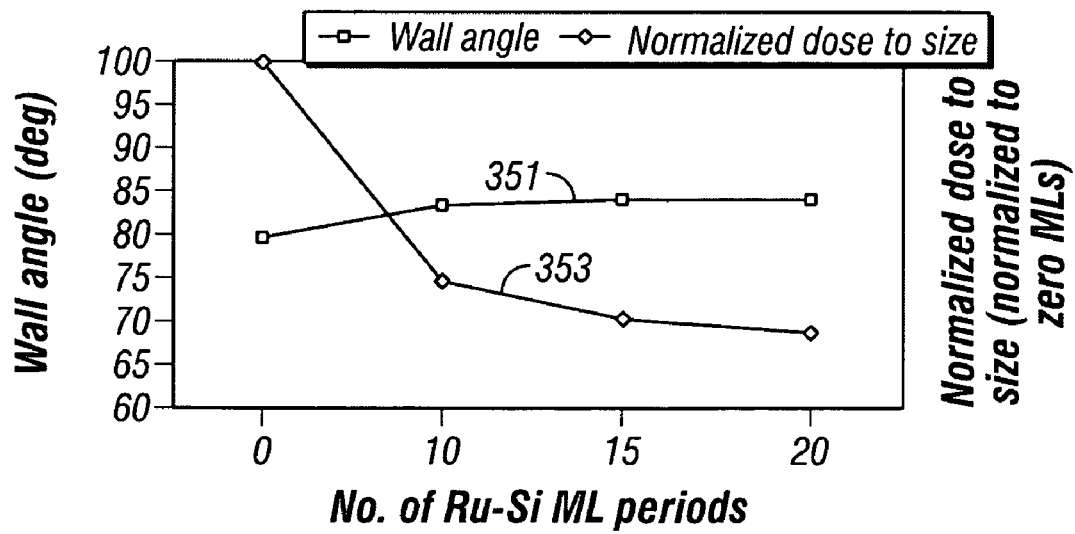
FIG. 3b shows a plot showing the impact of a multilayer reflective hardmask on photoresist profile and on dose to size.

Using a reflective hardmask allows the lower levels of the resist to absorb more light, thus improving both the sidewall angle and the amount of light exposure needed for development (which is inversely related to run rate). FIGS. 3a and 3b, illustrating simulations with 120 nm of a typical EUV resist patterning 100 nm lines/spaces with NA of 0.1 done with and without a Ru—Si reflective hardmask, demonstrate these improvements. As shown in FIG. 2b, increasing the number of multilayers increases the reflectivity of the hardmask; FIGS. 3a and 3b show the resulting improvements to resist profile 351 and dose to size 353 (a metric related to required exposure time). For example, fifteen periods of Ru—Si in the reflective multilayer was calculated to improve sidewall angle by 5 degrees and increase run rate by 30%. Thus, although there may be an increased complexity and apparent financial cost involved in adding a new process step, the improved sidewall profile and increased run rate may provide an actual cost reduction in addition to higher quality wafers. In one implementation, this improvement in run rate (or increase in photo speed) may be accomplished without significant changes to the resist being used.

Standing waves do not pose a significant problem in conventional EUV lithography because there is virtually no light that reflects off the bottom of the resist. The use of a reflective hardmask, though, may increase the standing waves in the resist. These EUV standing waves have a small periodicity (approximately $\lambda/4n$, where n=index of refraction of the resist (in one aspect, approximately 1) and $\lambda$=wavelength (in one aspect, 13.4 nm)). Thus, a small amount of diffusion during post-exposure bake (in one aspect, approximately 4 nm) may be sufficient to smooth out the effects of the standing waves.

Figure 4:
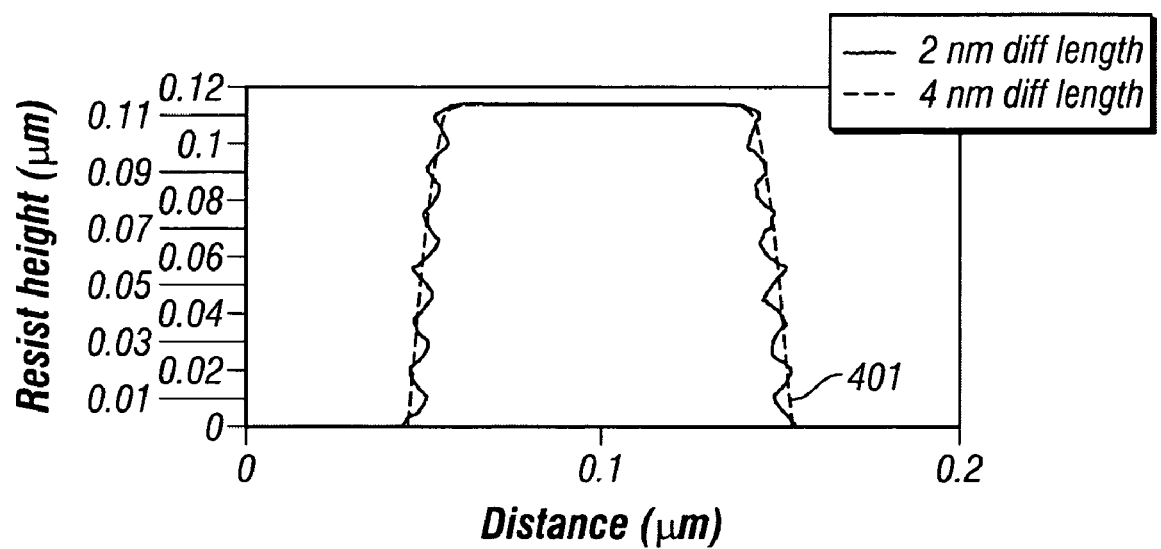
FIG. 4 shows a plot showing the impact of diffusion length on the effect of standing waves in the EUV spectral range.

FIG. 4 illustrates the effects of this process. The sidewall profile 401 may be adequately smoothed by choosing an appropriate diffusion length.

Figure 6:
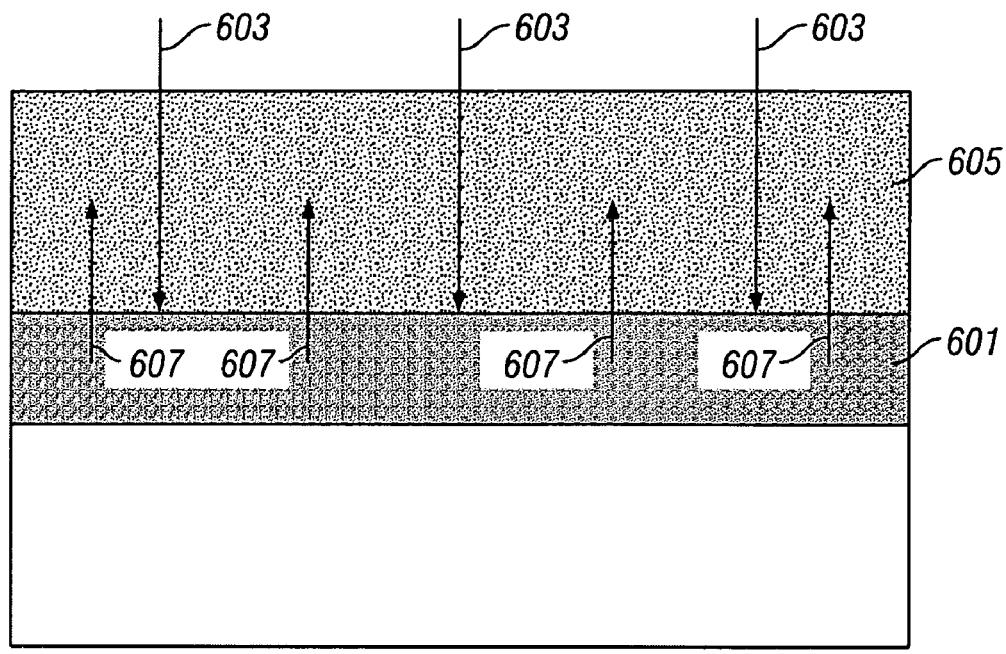
FIG. 6 shows a hardmask fluorescing energy back into photoresist material.

In an alternative implementation, the hardmask may be fluorescent to send energy back into the resist. Thus, as illustrated in FIG. 6, some energy 603 that passes through the resist 605 is fluoresced 607 by the hardmask 601 back into the lower surface of the resist 605. This may improve either or both the photo speed (amount of light/radiation exposure) and the resulting sidewall profiles. For example, the material STI-F10G, available from Star Tech Instruments in Danbury, Conn., has been demonstrated to fluoresce when excited by wavelengths from soft x-rays to DUV with submicron resolution. For longer DUV wavelengths, teraphenyl butadiene has shown much higher fluorescent efficiencies (peaking over 90% into 4 pi near 157 nm). Regardless of whichever fluorescent material is used, in this implementation the hardmask fluoresces into a spectral region where the resist is sensitive. For example, EUV resist are very sensitive in the deep UV range. Thus, in one implementation, the fluorescent hardmask absorbs EUV light (e.g. 13.5 nm) and fluoresces or re-radiates it in the deep UV range. In another implementation, the hardmask both fluoresces and reflects energy back into the resist.

Although the hardmask 601 is shown as a single layer, it may also be comprised of multiple-layers. Furthermore, although FIG. 6 shows the fluoresced energy 607 as originating within the hardmask 601, it should be understood that some or all of the fluorescence may occur at the interface between the hardmask 601 and the resist 605.

Figure 7:
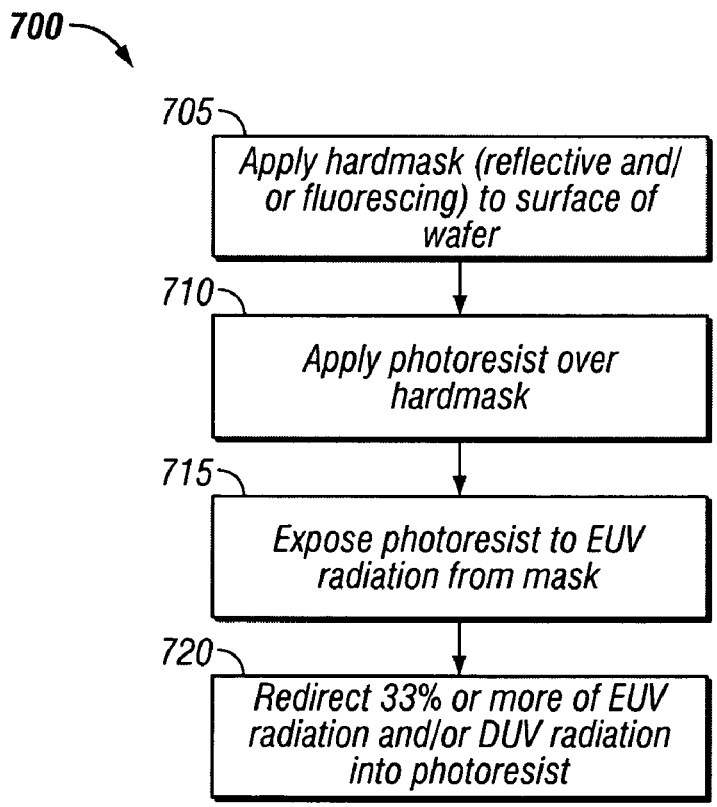
FIG. 7 shows a flowchart outlining a method of redirecting EUV energy into a resist.

FIG. 7 is a flowchart describing a method 700 for redirecting EUV energy into a photoresist. A hardmask (reflective and/or fluorescent to EUV wavelengths) may be applied to a surface of a wafer (block 705). A photoresist layer may then be applied over the hardmask (block 710). The resist may be exposed with EUV radiation from a mask defining a pattern (block 715) The hardmask may redirect 33% or more of a desired wavelength of EUV radiation (e.g., 13.5 nm) reaching the hardmask, if reflective, into the photoresist and/or DUV radiation if fluorescing (block 720).

A number of embodiments have been described. Nevertheless, it will be understood that various modifications may be made without departing from the spirit and scope of the invention. Accordingly, other embodiments may be within the scope of the following claims.

What is claimed is:

1. A method comprising:
    directing extreme ultraviolet electromagnetic energy from an energy source toward a photoresist, the photoresist having a first surface closer to the energy source than a second surface; and
    redirecting a portion of the electromagnetic energy reaching the second surface back into the photoresist, wherein the redirecting causes sidewall angles of a channel in the photoresist to be greater than or equal to approximately eighty degrees and less than or equal to approximately eighty-five degrees and wherein the redirecting comprises fluorescing the portion of the electromagnetic energy.

2. The method of claim 1, wherein the redirecting further comprises reflecting the portion of the electromagnetic energy.

3. The method of claim 2, wherein the reflecting comprises reflecting with a Bragg reflector.

4. The method of claim 2, wherein reflecting comprises reflecting with a reflector comprising multiple layers.

5. The method of claim 4, wherein the multiple layers comprise molybdenum and silicon.

6. The method of claim 4, wherein the multiple layers comprise ruthenium and silicon.

7. The method of claim 1, wherein said redirecting comprises redirecting at least 33% of the electromagnetic energy reaching the second surface.

8. A method for transferring a pattern to a semiconductor substrate, the method comprising:
    applying a reflective hardmask above a surface of the semiconductor substrate; applying a photoresist to a surface of the reflective material;
    directing extreme ultraviolet energy toward the photoresist;
    reflecting at least a portion of the radiation back into the photoresist; and
    fluorescing radiation into the photoresist, wherein the reflecting causes sidewall angles of a channel in the photoresist to be greater than or equal to approximately eighty degrees and less than or equal to approximately eighty-five degrees.

9. The method of claim 8, wherein the applying the reflective hardmask comprises applying a Bragg reflector.

10. The method of claim 8, wherein the applying the reflective hardmask comprises applying a plurality of layers, the plurality of layers including layers of different materials.

11. The method of claim 10, wherein the plurality of layers of materials comprise molybdenum and silicon.

12. The method of claim 10, wherein the plurality of layers of materials comprise ruthenium and silicon.

* * * * *